(12) United States Patent
Wood et al.

(10) Patent No.: US 12,020,684 B2
(45) Date of Patent: Jun. 25, 2024

(54) TEXT TO SPEECH ANNOUNCEMENT SYSTEM

(71) Applicant: Connectpoint, Inc., Goleta, CA (US)

(72) Inventors: Frederick A. Wood, Santa Barbara, CA (US); Charles Menzel, Ventura, CA (US)

(73) Assignee: CONNECTPOINT, INC., Goleta, CA (US)

( * ) Notice: Subject to any disclaimer, the term of this patent is extended or adjusted under 35 U.S.C. 154(b) by 173 days.

(21) Appl. No.: 17/547,685

(22) Filed: Dec. 10, 2021

(65) Prior Publication Data

US 2022/0199069 A1    Jun. 23, 2022

Related U.S. Application Data

(60) Provisional application No. 63/124,564, filed on Dec. 11, 2020.

(51) Int. Cl.
| | | |
|---|---|---|
| *H05K 5/06* | (2006.01) | |
| *G06F 1/3206* | (2019.01) | |
| *G10L 13/08* | (2013.01) | |
| *H04L 67/01* | (2022.01) | |
| *H05K 5/04* | (2006.01) | |

(52) U.S. Cl.
CPC ............ *G10L 13/08* (2013.01); *G06F 1/3206* (2013.01); *H04L 67/01* (2022.05); *H05K 5/04* (2013.01); *H05K 5/069* (2013.01)

(58) Field of Classification Search
CPC .................................. H05K 5/04; H05K 5/06
See application file for complete search history.

(56) References Cited

U.S. PATENT DOCUMENTS

| | | | |
|---|---|---|---|
| 9,672,732 B1 | 6/2017 | Aladas | |
| 10,852,770 B2* | 12/2020 | Ichikawa | G04B 47/066 |
| 2008/0152093 A1 | 2/2008 | Engleke et al. | |
| 2008/0251110 A1 | 10/2008 | Pede | |
| 2014/0192626 A1 | 7/2014 | Wolff et al. | |
| 2016/0259376 A1* | 9/2016 | Christfort | G06F 1/1635 |
| 2016/0364009 A1* | 12/2016 | Lemberger | H04N 21/4424 |
| 2019/0003196 A1* | 1/2019 | Hall | E04H 6/42 |
| 2019/0035263 A1 | 1/2019 | Loes | |
| 2019/0215444 A1* | 7/2019 | Deng | G06F 1/1656 |
| 2020/0137911 A1* | 4/2020 | Kim | H05K 5/0247 |
| 2020/0364990 A1* | 11/2020 | Stogel | G08B 3/10 |
| 2022/0084520 A1* | 3/2022 | White | B25F 5/00 |

OTHER PUBLICATIONS

USPTO/ISA, International Search Report and Written Opinion for PCT Application No. PCT/US2021/062891. dated Mar. 15, 2022.

* cited by examiner

*Primary Examiner* — Hung V Ngo (74) *Attorney, Agent, or Firm* — SoCal IP Law Group LLP; Mark Andrew Goldstein (57) ABSTRACT

There is disclosed a text to speech announcement system capable of operating without an external power source for long periods of time.

20 Claims, 6 Drawing Sheets

TEXT TO SPEECH ANNOUNCEMENT SYSTEM

RELATED APPLICATION INFORMATION

This patent claims priority from provisional patent applications: 63/124,564 filed Dec. 11, 2020, the contents of which are included by reference in their entirety.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to wireless communications systems, specifically systems that may be used to announce traffic data related to different transportation systems to users that may have a visual impairment.

Description of the Related Art

The world is designed for people that are not visually impaired. This is true for systems we use in everyday life such as public and private transportation. Driving requires looking at signs, using a subway requires viewing schedules, airlines require following signs and processing information regarding arrivals and departures, loading areas and baggage claims. Certain jurisdictions have mandated standards for those that are visually impaired. Following these mandates is difficult if not impossible because the technology available today does not currently allow for easy implementation of these standards. The systems described herein address these issues.

Throughout this description, elements appearing in figures are assigned three-digit reference designators, where the most significant digit is the figure number, and the two least significant digits are specific to the element. An element that is not described in conjunction with a figure may be presumed to have the same characteristics and function as a previously described element having a reference designator with the same least significant digits.

DETAILED DESCRIPTION

Description of Apparatus

Figure 1:
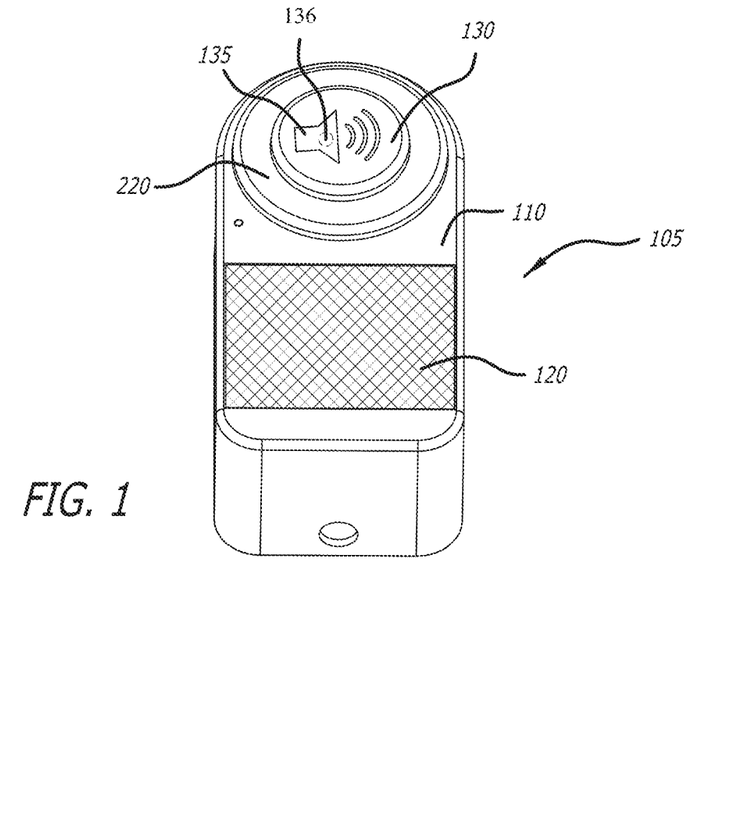
FIG. 1 is a drawing of a front view of the announcement system.

Referring now to FIG. 1 there is a drawing of a front view of an announcement system. Announcement system 105 is primarily composed of a waterproof housing 110. Waterproof housing 110 is primarily composed of a metal and may come in one solid piece. In other embodiments waterproof housing 110 may be composed of multiple pieces fitted together to create one continuous metal housing in which other components may reside. A key feature to housing 110 being weatherproof is the lack of excessive holes or openings which reduce or eliminate the ability of water from rain snow and sleet or other elements to get inside. In addition, the housing 110 is made from metal or other material that is sufficiently thick to withstand impacts from wind and elements or even persons hitting the device. Constructing announcement system 105 from thin metal or other materials will likely not work as the entire system will be too fragile to survive being outdoors for long periods of time.

Additionally waterproof housing 110 may itself be made of a conducting material or be attached to other materials so when certain electrical energy is run through, an auditory signal may be generated. That is in certain embodiments the waterproof housing itself may act as a speaker giving instructions to a user using the system.

Affixed to waterproof metal housing 110 is speaker 120. Speaker 120 may either be formed from waterproof metal housing 110, or be an auxiliary part that is attached to the waterproof metal housing. The speaker may convert electrical energy into sound waves that may be heard by a visually impaired person. In other embodiments additional solar panels may be affixed to the area in which speaker 120 resides on the device. In other embodiments speaker 120 may not be a speaker at all but simply more solar panels.

Push button 130 has an outward portion (shown in FIG. 1) that may be pressed by a user. Push button 130 (discussed more below) is ADA compliant and compatible. Certain specifications required by various regulations make a regular push button not suitable because a visually impaired person would not be able to use and operate other buttons. Push button 130 may also have engraved graphic 135. The engraved graphic may be a symbol or engraving that indicates to a visually impaired person that the button may be pressed to generate a sound. The outward protruding portion of the push button in one embodiment should be a minimum of 2 inches (51 mm) across and the force to push the button must be no greater than 3.5 pounds (15.5 N). These specific requirements are favorable for those with vision impairments because for those that have limited vision, the diameter of the button makes it possible to view the button for those that are not entirely blind but still have some vision capabilities, and the required force to press the button makes it so that those that are vision impaired do not have to try pressing too hard to realize if the button has been pressed or not. Embedded light 136 may be found on engraved graphic 135. In other embodiments, embedded light 136 can be found below the push button or anywhere on the waterproof housing 110. The embedded light may also be referred to as the visible indicator.

One example of the text to speech announcement system includes, an apparatus for providing instructions to a visually impaired person comprising: a waterproof metal housing with a cavity for internal components, a top portion of the waterproof metal housing including a solar panel, a back portion of the waterproof metal housing including a locking mechanism and a mounting mechanism, a front end of the waterproof metal housing including a push button with the outward portion of the push button protruding outwardly, a button protrusion formed from metal adjacent to the push button, a battery included in the cavity and connected to the solar panel; a speaker included in the cavity and connected to the battery; an internal portion of the button included in the cavity and; a computer included in the cavity and connected to the battery and the speaker wherein the computer is configured to receive instructions from a wireless network; relay electronic signals to the speaker in accordance with the received instructions to generate an audio signal. Additionally, the speaker described in the previous sentence may be an exciter speaker that vibrates sound throughout the metal housing.

In other embodiments the outward protruding portion of the push button is a minimum of 2 inches (51 mm) across and the force to push the button is no greater than 3.5 pounds (15.5 N). The outward protruding portion of the push button may have a diameter of 2 inches (51 mm). Additionally in some text to speech announcement systems the computer sends a signal to the speaker and a locator tone is played once the button has been pushed.

Locator tones may come in many different varieties. In some embodiments a single tone may be played. The locator tone should be between 20 Hz to 20,000 Hz in order to be heard by a human. For those with a slight hearing impairment or even just those with sensitive hearing a frequency of 2,000 Hz-5,000 Hz may be selected. Locator tones may be a single beep or tone or may have a message. In other embodiments, the locator tone may be a version of a preamble (discussed more below). The apparatus or kit may be configured so that after the computer sends a first electronic signal to the speaker a locator tone between 20 Hz to 20,000 Hz is played by a speaker once the button has been pushed.

The visible indicator can be the activation or lit by the lighting up of embedded light 136. In some instances, a specific pattern of light flashing can be used. An appropriate pattern includes the light on for two seconds, off for two seconds, and then on again for two seconds. In other embodiments the instructions from a wireless network further comprise receiving a button press from a user, sending a request to a server, receiving a response from the server, receiving instructions regarding at least one preamble.

In other embodiments there is a first preamble which states a departure address and a departure time, a second preamble which states an arrival address and an arrival time. The preambles may even display custom messages that may be preprogrammed ahead of time. In other embodiments the solar panel is a flexible conforming solar panel affixed to and conforming to at least a portion of the body of the waterproof metal housing. In other embodiments the computer is in communication with a screen that displays visual instructions.

Figure 2:
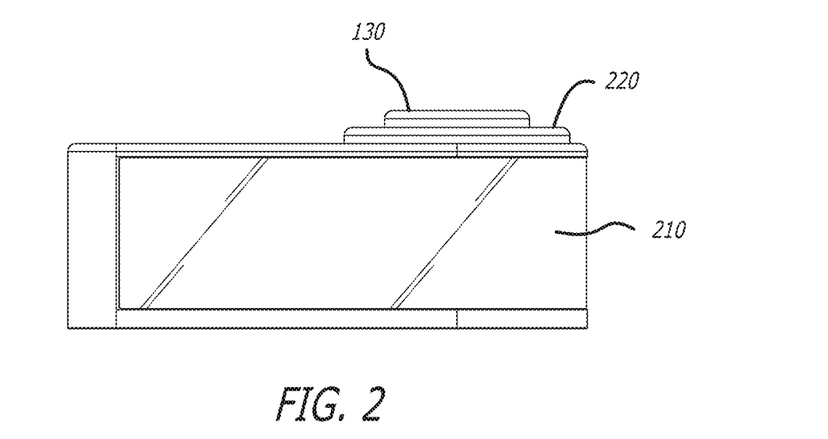
FIG. 2 is a side view drawing of the announcement system.

Turning to FIG. 2 there is a side view of the apparatus. Solar panel 210 may be found on the top portion of the waterproof metal housing 110. It is important for the solar panel to be found on the top portion of the device because to work, the solar panel must be in direct contact with the sunlight hitting the solar panels. In other embodiments the solar panels may be found on other areas of the waterproof metal housing such as the front, back or even bottom if a reflective surface is found beneath the entire device. Conventional rigid solar panels may not be favorable for the device because they may not be able to capture as much solar energy from the sun as flexible conforming solar panels. Catching enough sunlight is crucial to the system because unlike conventional systems, the present disclosure does not connect itself to a conventional power system and must rely on internal battery power for long periods of time without a conventional battery recharge or battery replacement.

Flexible solar panels not only catch more solar energy from the sun, but are also more difficult to steal. This is another added benefit of using flexible solar panels as opposed to conventional rigid ones. Because the apparatus will be left outside for extended periods of times exposed to the general public, a solar panel that is hard to steal or harm should be used.

Solar panel 210 may be made from a flexible material. Though rigid solar panels may also be used, in the experience of the inventors, flexible solar panels that conform to the body of the device account for more efficient energy transfer. Button frame 220 is also shown in FIG. 2. Button protrusion 220 may or may not be part of push button 130. Button frame 220 may be an additional piece of metal or material attached to waterproof metal housing 110. Button frame 220 serves to better protect the interior of housing 110 from the elements which further contributes to the device's waterproofing. Making button frame 220 a different color than push button 130 can also aid those that are vision impaired to see the device. In the experience of the inventors coloring button frame 220 a hue of yellow helps people with a vision impairment, but not total loss of vision, locate the apparatus for use.

The apparatus may also be configured so as to give the button a visual contrast with the background of at least 70%. This may or may not be accomplished through the use of button frame 220. When the background is a particularly dark color (such as a subway terminal with a wall of dark blue tile), making push button 130 and/or button frame 220 a particular color that is in stark contrast to the background color is helpful, particularly when a color contrast of at least 70% is obtained. A visual contrast of at least 70% is helpful for those with a visual impairment because it helps those with limited vision to see the apparatus from the rest of the environment.

Visual contrast may be measured by the difference in luminance. Specifically, luminance may be obtained by subtracting the amount of reflected light between two surfaces. A potential formula for calculating contrast is Contrast=(Lmax−Lmin)/(Lmax+Lmin) where Lmax is the luminescence of a darker surface and Lmin is the luminescence of the lighter surface. When a darker surface is black, the luminescence ratio may be 1 (or 100% visual contrast). If a hue of yellow is selected, then a visual contrast of around 70% may be obtained.

Figure 3:
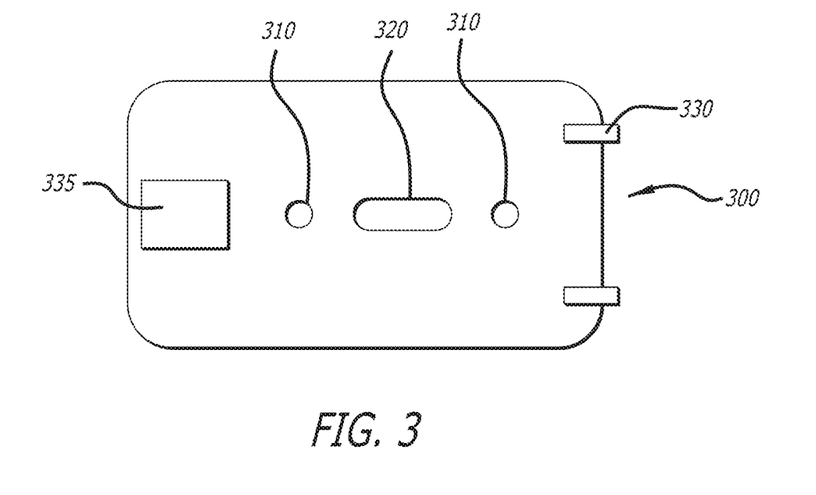
FIG. 3 is a drawing of the locking and mounting system for the announcement system.

Turning to FIG. 3 there is a drawing of a mounting plate 300. Mounting plate 300 may be constructed from the same material as housing 110. Mounting plate 300 has at least two holes 310 which may be created by punching them out of the metal making mounting plate 300. Drilling may also be used to make the holes and ellipse. Ellipse 320 may also be formed by punching out material in plate 300. Drilling may also form Ellipse 320. Mounting plate 300 may also contain a tab 330. Tab 330 is composed of material attached to or integral with the mounting plate. Tab 330 may be used to attach the mounting plate to the locking mechanism or entire apparatus. Tab 335 may serve a similar function to tab 330 but may be of a different size. In FIG. 3 (not drawn to scale) tab 335 is larger and of a different construction than tab 330. The tabs need not be uniform or consistent on all apparatuses, their purpose is to interact with the waterproof housing 110 to seal the entire device and to weatherproof it. Hole 310 and ellipse 320 may also be formed by drilling as opposed to stamping.

Figure 4:
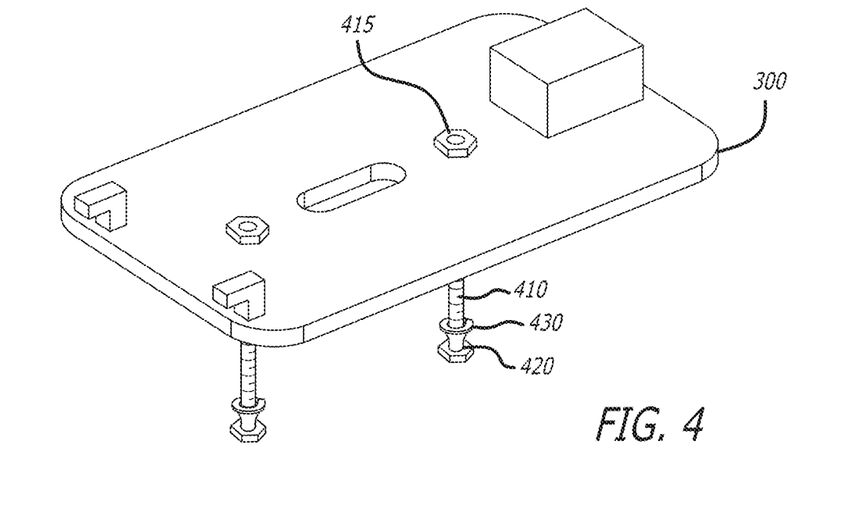
FIG. 4 is a drawing of the mounting system ready to be mounted.

Turning to FIG. 4 there is a drawing of mounting plate 300 with bolts, breakaway nuts, and lock washers for installation. Bolt 410 is run through hole 300. The purpose of the bolt is to attach the mounting plate to a pole or other structure and allow the device to be in a stationary position. In other embodiments Bolt 410 may be replaced with a magnet or other fastener to affix the device to a stationary surface. In other embodiments the back of the device may be affixed to yet another mounting plate such as a plate of stainless steel, and the stainless steel itself mounted to an appropriate area.

The mounting mechanism may further comprise, a metal mounting plate with at least two circular holes and at least one ellipse, two breakaway nuts, two lock washers, and two bolts, and at least three tabs to attach to the back of a waterproof metal housing. In other embodiments it may be attached to a pole such a mounting pole 510 in FIG. 5 or other external mounting structures. Nut 415 may be found on an inner portion of the mounting plate and be on the inside of the waterproof metal housing. Breakaway nut 420 may be affixed to a distal end of bolt 410. Breakaway nuts are preferred because once applied a portion of the nut may be removed which makes it difficult for vandals to try and remove the device from its mounting point. Crush washer 430 may be applied right before the breakaway nut to add stability and reduce friction between the bolt and nut.

A typical installation process includes running two 410 bolts through the mounting plate 300 and a pole. The bolts may be run through hole 310 or ellipse 320. One crush washer 430 may be installed per bolt 410. A breakaway nut may then be placed on each bolt and tightened until the nut snaps off and only a breakaway cone from the breakaway nut remains. Breakaway nuts are usually not used for announcement system devices because such devices usually require conventional nuts that can be unscrewed to be used. This is because other devices require constant maintenance and require a device be mounted and unmounted regularly. By utilizing a separate mounting plate and breakaway nuts, the entire apparatus remains durable and subject to inspection or battery replacement when need be.

Figure 5:
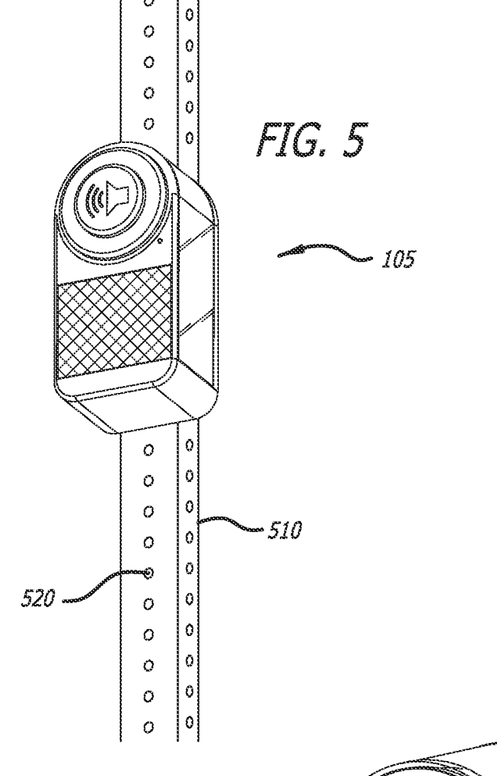
FIG. 5 is a drawing of the announcement system mounted.

Turning to FIG. 5 there is a drawing of an announcement system attached to mounting pole 510. Mounting pole 510 may be a custom mounting system or conventional pole used to mount signs and other displays in a civil engineering environment. The backside of announcement system 105 is attached to mounting plate 300. Bolts 410 have been run through mounting pole holes 520 on the mounting pole 510. In some cases, during installation additional holes or the holes themselves may be drilled by a technician.

Figure 6:
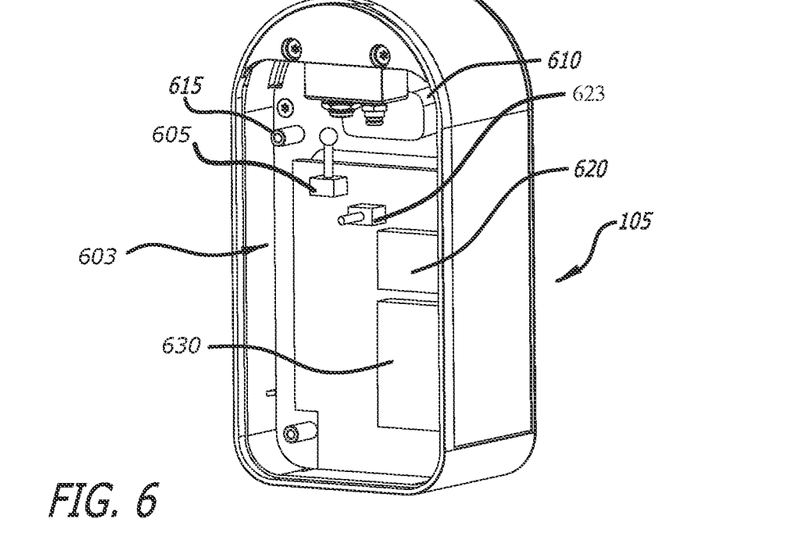
FIG. 6 is a drawing of the inside of the announcement system.

Turning to FIG. 6 there is a drawing of the back of the text to speech announcement system 105. Note the locking mechanism and mounting mechanism are not shown. Cavity 603 is a space within the waterproof housing where other components may be stored and operate. Cavity 603 is the space that houses the rest of the components. FIG. 6 contains an internal portion of the push button 130 shown as 610. Tab hole 615 can be used to attach to an end of tab 330 or 335. Computer 620 is the controller of the device. In some embodiments the computer may be a printed circuit board (PCB) with components embedded in it and custom software and firmware installed. In other embodiments it may be a device such as a Raspberry Pi or smartphone configured to perform specific operations for relaying auditory and visual information.

Computer 620 draws power from battery 630. Battery 630 is not connected to an outside power source such as a power outlet or building power system. The entire device achieves waterproofing and weatherproofing in part because electrical energy is not transmitted to the device via wire or other conventional method. The device obtains power by solar energy from the solar panels on the device. In other embodiments the battery may be removed for maintenance at a specified time and either recharged at a separate area, or replaced. Lithium-ion batteries can be used however primary cell and secondary cell batteries may also be used.

Exciter speaker 623 may also be found in cavity 603. Exciter speaker 623 may operate like a traditional speaker converting electrical energy into physical sound waves that may be accessed by a human ear. However, exciter speakers also cause the vibration of physical material announcement system 105. The physical vibration of announcement system 105 causes more sound waves to be generated within announcement system 105, that eventually reach the outside of the system and may reach a user's ear. Exciter speakers are superior to regular speakers for the device because they can use less energy to generate more sound. Additionally, the use of an exciter speaker allows for a more compact design. A larger regular speaker consuming more energy would be required to generate sound at the same decibel (dB) as an exciter speaker conducting vibrations through components of announcement system 105.

Figure 7:
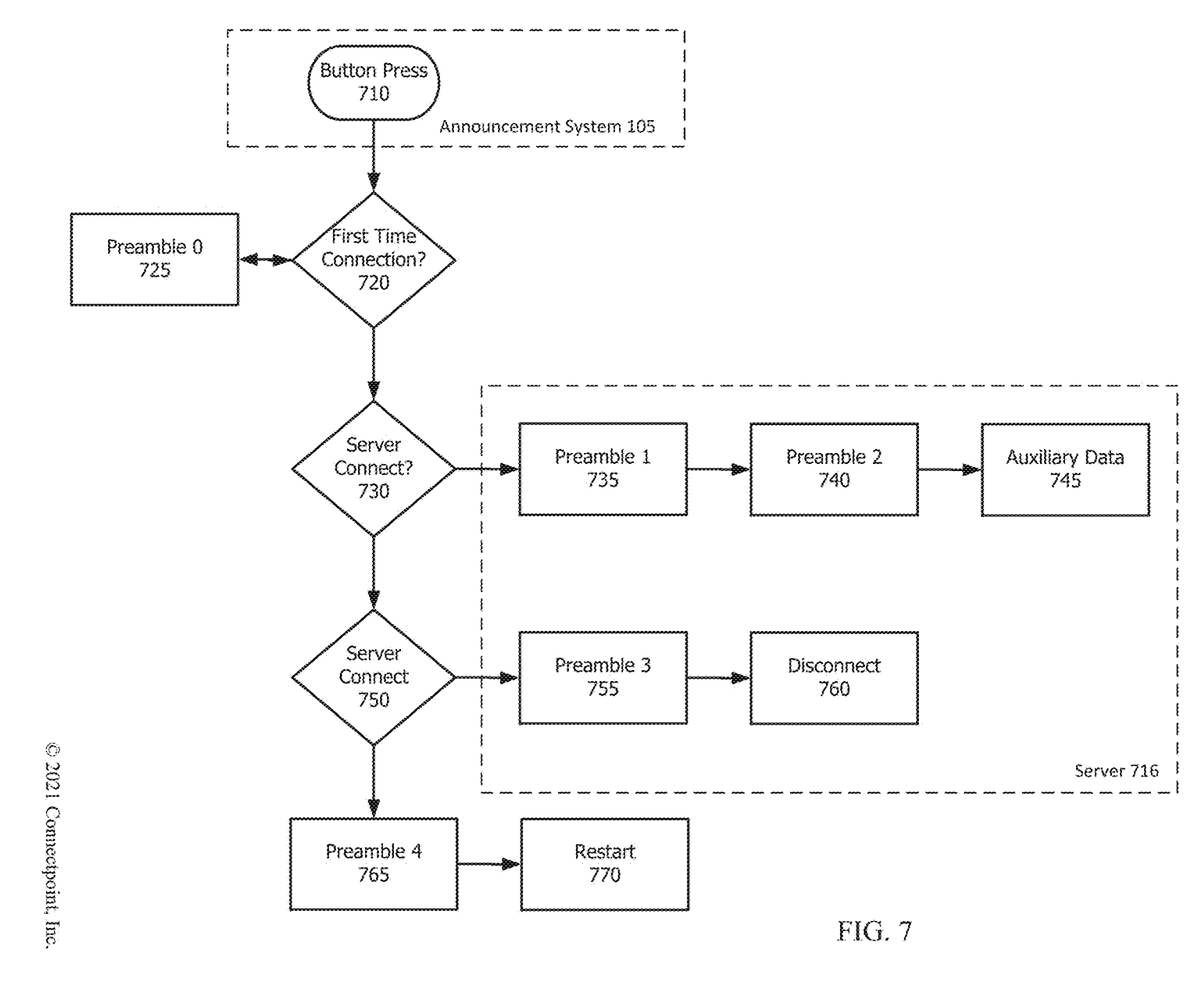
FIG. 7 is drawing of a flowchart of actions taken by the announcement system to receive instructions.

Turning to FIG. 7 there is a flow chart of the interaction between the device and a user which necessitates communication between the device and a server. A server may house data and be in communication with a text to speech announcement system. Custom software integrated with computer 620 is specifically designed for communicating via low power/bandwidth (Cat-M1) to an outside server.

The process may begin when user presses push button 130. If the device has not been used in a long time it may be in a low power state in which all internal processes have minimal power (if any) running through them. When the button has been pressed, the computer will then check if there has been an initial (first time) connection at 720. Preamble 0 may then be played at 725. Preamble 0 may be a welcome message or any number of preprogrammed preambles such as date and time, location, stop number, or a custom message. At 730, computer 620 via wireless receiver 605 tries to communicate with the server. If the connection is successful, the server may send the computer information regarding a preamble 1, a preamble 2, or auxiliary data. Preambles may take the form of many data types and relay many different messages. Preambles may be MP3 files, computer code, links to other data or data files.

In certain embodiments the device may play preamble 1, which could be a welcome message and/or a location message, then preamble 2 which could be a time and date of the next stop at that area. The auxiliary data could be information to be displayed on a visual display if included in and utilized by the device. In other embodiments, the auxiliary data could be a bank of other preambles to be played in the event contact with the server is lost or if it is more energy efficient to not keep contacting the server.

Moving to server connect 750, computer 620 may try to access the server a second time if the first time was not successful or if the auxiliary data downloaded at 745 contained an instruction to contact the server again. If there is a successful connection at 750, then preamble 3 from 755 may be downloaded to computer 620. In some embodiments preamble 3 may actually contain the information of 735, 740, and 745, and preamble 3 is simply a backup if server connect 730 is unsuccessful. In other embodiments preamble 3 may be an entirely new message such as an updated time departure or goodbye message.

After preamble 3 has been downloaded the server could direct the system to disconnect from communicating with the server at 760. Disconnecting from the server is important because maintaining a constant connection to the server may drain energy unnecessarily from the system. Though establishing a new connection with the server may consume power, starting the connection only when it is needed actually saves power overall. Moving to 765 preamble 4 may be played to a user. Preamble 4 may be preprogrammed into computer 620 or have been preprogrammed by auxiliary data downloaded at 745 or even from data from preamble 3. Finally at 770 the process may restart. A restart may involve a powering off of the entire system until the next button press at 710. A restart may also involve putting the device in a state of low power, and only increasing power to the device when a button press occurs.

An outside server may handle and manage data from remote transit devices. The data from the remote transit devices may be obtained from other auxiliary transit devices themselves such as a computer operated by a train conductor, or data from a toll booth regarding number of passengers or stops coming up.

In some embodiments the text to speech announcement system may be considered the client (announcement system 105, or more specifically computer 620) and an outside computer may be the server (server 716). Connect point asset management (CPAM) is a software package that may be run on the server computer and be operated by a human being to facilitate the input and management of data on the server. All aspects of remote devices may be handled by a CPAM back end. Critical data may be fed from the device to data based on CPAM. Some examples of this are device data such as temperature, last heartbeat, connectivity strength and battery voltage. In addition, CPAM may display what is currently being displayed or spoken by the system to the user.

In other embodiments a button press at 710 may result in a PSM error. If a PSM error occurs, then the entire system may need to reboot at step 710 and the step may be repeated. At connection 720 the system may then load an agency stop and name from the server or internally saved preamble. At preamble 0, 725 a message such as "please wait while we retrieve the latest next departure information" may be played. There may be a larger pause between the message of the preamble being played if it is the first instance of the message and next departure being played. Often times a message may be played at a longer length to cover latency between communication with server 716 and announcement system 105.

The server may compile and parse real-time data currently for all displays. An API used from CPAM on the server may have data pre-ready or processed data ready in the format needed to program based on the project requirements. Data and/or graphics can be stored locally depending on when needed and to reduce energy use by optimization of sleep.

Real time data feeds regarding trip information may be used to obtain data for preambles related to stop information. However, feeds generated by computers not party to the server or text to speech announcement system may have data missing or in some cases inaccurate data that needs further processing. Inaccurate data can be cleansed with logic to compare accuracy of data. For example, the server may obtain data from Google information regarding a stop on a metro station in DC, and also obtain information related to the same stop from the Metro itself. However, the Metro time may be off by a few seconds whereas the information from Google may be right on time. The server may have functions including comparators that can compare the data from two or more sources and judge which time to use when formulating a preamble.

In other embodiments a preprogrammed schedule may be used to fill data from the preamble. For example, there are scenarios where having the device sleep and not connect to the server for a long time are favorable such as systems that are located in rural areas or that send information that does not change or need updates often. Some devices may sleep for long periods and update weekly with current scheduled data. Real-time feeds may come from third party computers that track vehicle movement such as bus movements along a route coupled with prediction algorithms to calculate when the bus will reach a specific destination.

Computer 620 may contact the server under different time intervals. In some embodiments making a connection every one to two minutes may be appropriate. One minute is what most agencies require. In some cases, agencies with on-bus tracking may want to "plot" real-time locations of bus movement down to ten seconds. This is typically used for plotting movement on conventional announcement systems. When a visual display is integrated into the system, plot data may be used to visually display to a user update for when a vehicle arrives. Based on the frequency of bus movements from a bus schedule, the device will to check in with the server to determine when data is changed. This can be from one minute to many hours.

Each text to speech announcement system may be installed at a specific stop. To optimize power usage, the preamble of FIG. 7 may be preloaded into computer 620. Examples of specific preambles include route numbers, titles, and descriptions which are specific to a stop. Other information that may be stored in the preamble of FIG. 7 includes a stop ID, a stop name, a route number, a route title, a route description, date of update. The data to be included in the preamble can change and needs to be compared to relevant data on the server to determine if it needs to be updated to the client. Additional information that may be stored in the preamble includes route real-time information such as departure time, alerts, and sleep data.

Figure 8:
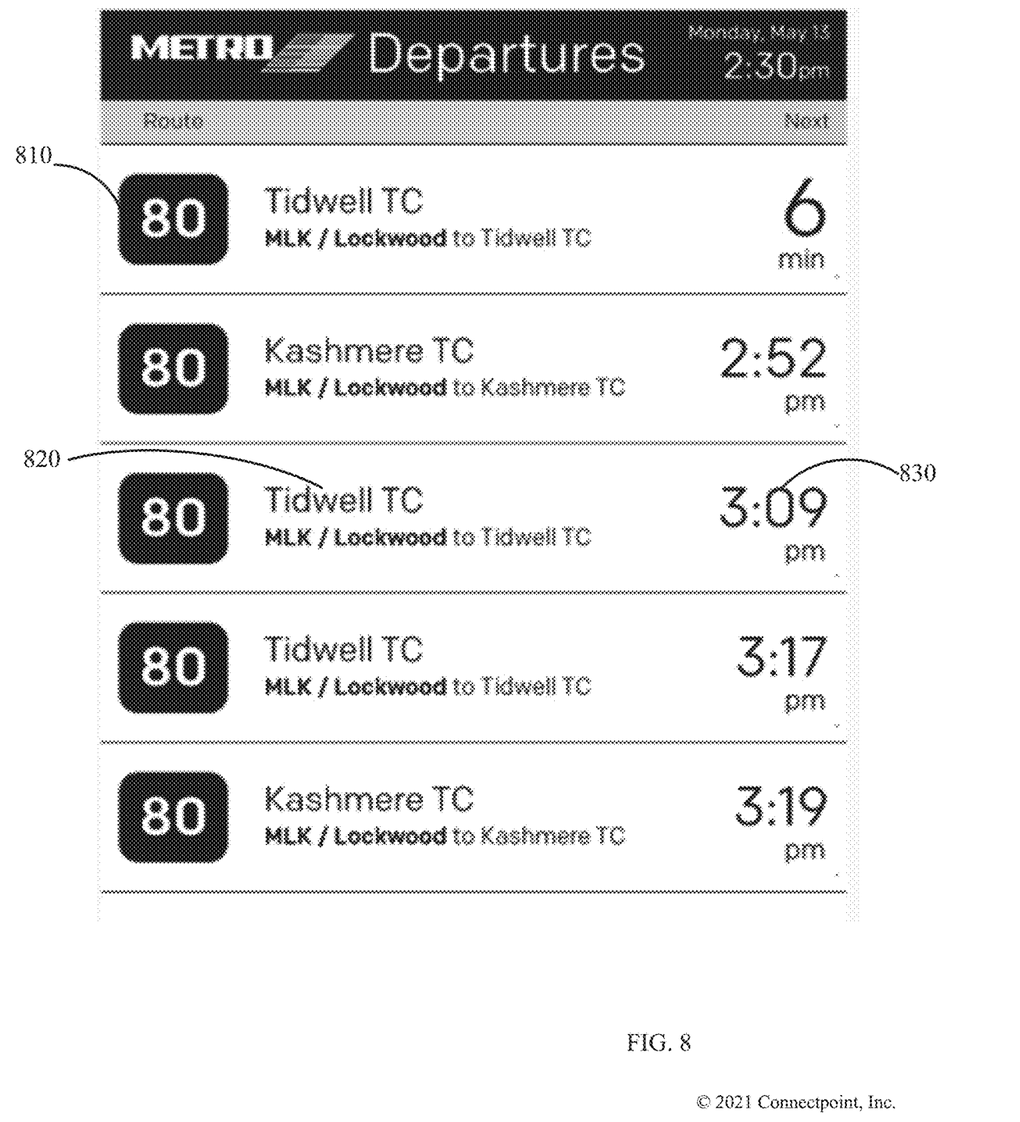
FIG. 8 is a drawing of visualized system data.
Figure 9:
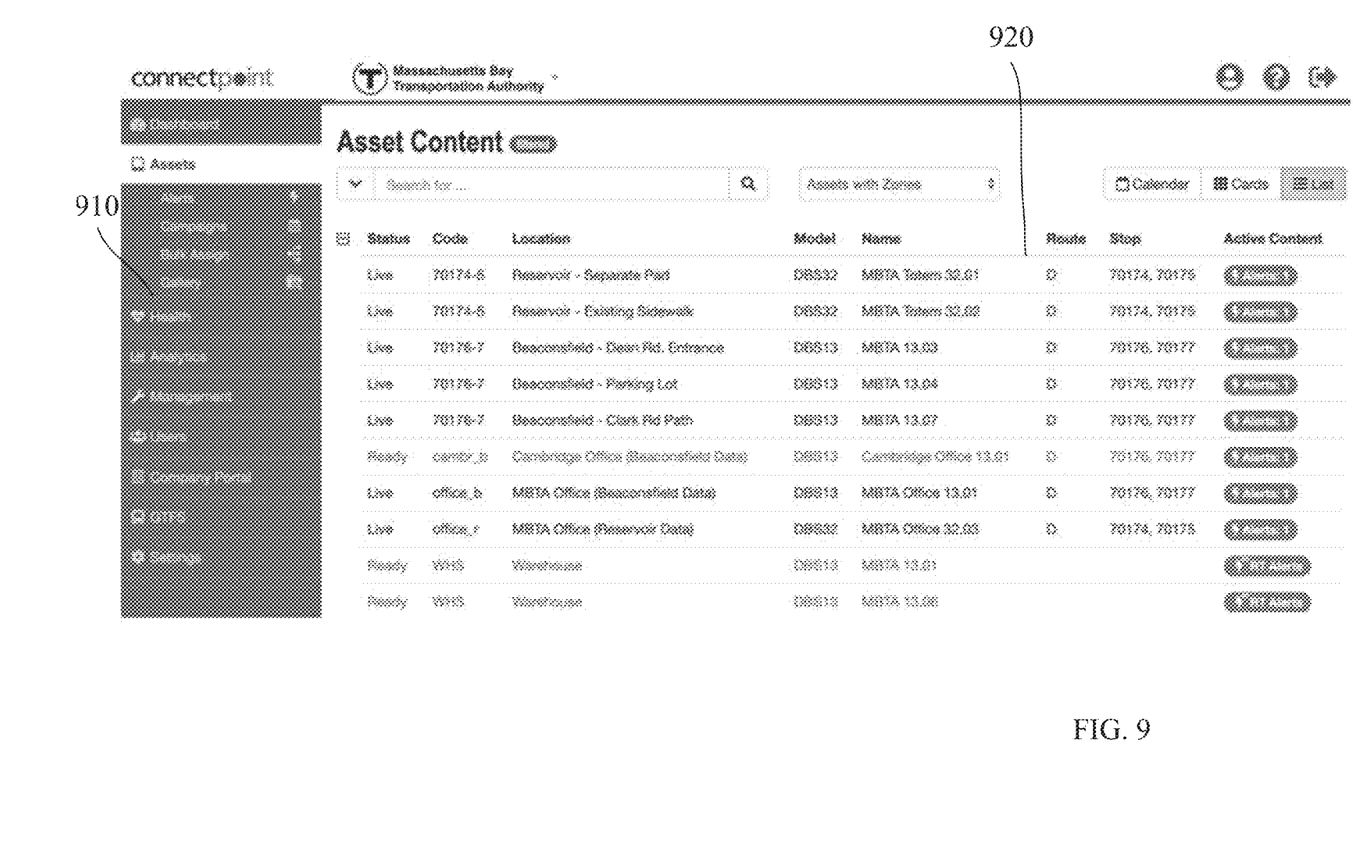
FIG. 9 is a drawing of an API for running a server used with the system.

FIG. 8 and FIG. 9 both show a visual display of what someone imputing data for the server could see. FIG. 8 shows data obtained from a transport system, in this case the metro. Note how the information contains a route number 810, a stop information 820 and time estimate 830. In some embodiments information 810, 820, and 830 may be processed by the server digitally with no need for a human to process or input the data. In others a human may need to input this information manually to the server. Additionally, the data types in 810, 820, and 830 may all be considered preambles and could be imputed as such.

Some transportation systems have their very own APIs or databases where data may be collected from. For example, a bus depot may have data related to the time, bus number, stop number, and time estimate a certain trip will take. This data may be automatically uploaded to the server, and even periodically check to make sure accurate data is obtained. In some circumstances transportation systems may send out signals when data changes, in others it is favorable for the server to periodically check to ensure that no data has been changed, or update if data has been changed.

Turning to FIG. 9, there is a drawing of an API that can be used to view and program information into a server. Dashboard 910 contains multiple options a user can select from to view data regarding different parts of the system. For example, a user may select health to view attributes about the text to speech announcement system such as battery life, whether there is a computer failure or error code transmitted from the computer back to the server. Computer 620 may process data not only related to relaying information to the user but also may monitor data related to the system overall. Asset data 920 can display information regarding transit data, or the text to speech announcement system. A user may append or update data within asset data 920.

In addition to a text to speech announcement system itself, there may also be a kit for constructing such a system. A way of constructing the system includes a kit for constructing an apparatus for providing instructions to a visually impaired person comprising: a waterproof metal housing with a cavity for internal components, a top portion of the waterproof metal housing attached to a solar panel, a back portion of the waterproof metal housing attached to a locking mechanism and a mounting mechanism, a front end of the waterproof metal housing connected to a portion of a push button with the outward portion of the push button protruding outwardly; a battery included in the cavity and connected to the solar panel; a speaker included in the cavity and connected to the battery; an internal portion of the button included in the cavity and; a computer included in the cavity and connected to the battery and the speaker wherein the computer is configured to receive instructions from a wireless network; relay electronic signals to the speaker in accordance with the received instructions to generate an audio signal.

This kit can be further modified by customizing the push button. For example, the kit may contain a push button wherein the push button is a minimum of 2 inches (51 mm) across and the force to push the button is no greater than 3.5 pounds (15.5 N). The kit may also provide for a system wherein a locator tone is played once the button has been pushed. The kit may also provide for a locator tone that is played once the button is pressed and the button displays a visible indicator via a light.

The kit may further provide for wherein the mounting mechanism further comprises, a metal mounting plate with at least two circular holes and at least one ellipse, two breakaway nuts, two lock washers, and two bolts, and at least three tabs to attach to the back of a waterproof metal housing. The kit may further provide wherein the solar panel is a flexible conforming solar panel affixed to and conforming to at least a portion of the body of the waterproof metal housing.

Additionally, a kit may contain a screen or be fashioned in a way to accept a digital screen to display visual instructions. The kit could be configured wherein the computer is communicatively connected to a screen that displays visual instructions. E-ink screens may work but LCD and other digital screens may be used as well.

It is claimed:

1. An apparatus for providing instructions to a visually impaired person comprising:
    a waterproof metal housing with a cavity for internal components, a top portion of the waterproof metal housing including a solar panel, a back portion of the waterproof metal housing including a locking mechanism and a mounting mechanism, a front end of the waterproof metal housing including a push button with the outward portion of the push button protruding outwardly;
    a battery included in the cavity and connected to the solar panel;
    a speaker included in the cavity and connected to the battery;
    an internal portion of the button included in the cavity and;
    a computer included in the cavity and connected to the battery and the speaker, wherein the computer is configured to receive instructions from a wireless network and relay electronic signals to the speaker in accordance with the received instructions to generate an audio signal.

2. The apparatus of claim 1 wherein the outward protruding portion of the push button is a minimum of 2 inches (51 mm) across and the force to push the button is no greater than 3.5 pounds (15.5 N).

3. The apparatus of claim 1 wherein after the computer sends a first electronic signal to the speaker a locator tone is played by a speaker once the button has been pushed.

4. The apparatus of claim 1 wherein the speaker is an exciter speaker that vibrates sound throughout the metal housing.

5. The apparatus of claim 1 wherein the instructions from a wireless network further comprise receiving a button press from a user, sending a request to a server, receiving a response from the server including instructions regarding at least one preamble.

6. The apparatus of claim 5 wherein the at least one preamble includes a first preamble which includes a departure address and a departure time, a second preamble which states an arrival address and an arrival time.

7. The apparatus of claim 1 wherein the mounting mechanism further comprises, a metal mounting plate with at least two circular holes and at least one ellipse, two breakaway nuts, two lock washers, and two bolts, and at least three tabs to attach to the back of the waterproof metal housing.

8. The apparatus of claim 1 wherein the solar panel is a flexible conforming solar panel affixed to and conforming to at least a portion of the body of the waterproof metal housing.

9. The apparatus of claim 1 wherein the button has a visual contrast of at least 70%.

10. The apparatus of claim 1 wherein the computer is in communication with a display that displays visual instructions.

11. A method of delivering instructions to a visually impaired person comprising:
    providing a waterproof metal housing with a cavity for internal components, a top portion of the waterproof metal housing including a solar panel, a back portion of the waterproof metal housing including a locking mechanism and a mounting mechanism, a front end of the waterproof metal housing including a push button with the outward portion of the push button protruding outwardly;
    a battery included in the cavity and connected to the solar panel;
    a speaker included in the cavity and connected to the battery;
    an internal portion of the button included in the cavity and;
    a computer included in the cavity and connected to the battery and the speaker wherein the computer is configured to
receive instructions from a wireless network;
relay electronic signals to the speaker in accordance with the received instructions to generate an audio signal;
receiving a button press from a user;
the button relaying a signal to the computer within the cavity;
the computer receiving instructions from a wireless network;
the computer relaying electronic signals to the speaker in accordance with the received instructions to generate an audio signal.

12. The method of claim 11 wherein the button has a visual contrast of at least 70%.

13. The method of claim 11 wherein after the button is pressed the button displays a visible indicator via a light and the speaker presents an audible indicator.

14. The method of claim 11 wherein the wireless network includes a server, the server containing and transmitting at least one of the datatypes for a preamble of, a stop ID, a stop name, a route number or identifier, a route title, a route description, a date of update, an alert.

15. A kit for constructing an apparatus for providing instructions to a visually impaired person comprising:
a waterproof metal housing with a cavity for internal components, a top portion of the waterproof metal housing attached to a solar panel, a back portion of the waterproof metal housing attached to a locking mechanism and a mounting mechanism, a front end of the waterproof metal housing connected to a portion of a push button with the outward portion of the push button protruding outwardly;
a battery included in the cavity and connected to the solar panel;
a speaker included in the cavity and connected to the battery;
an internal portion of the button included in the cavity and;
a computer included in the cavity and connected to the battery and the speaker
wherein the computer is configured to
receive instructions from a wireless network;
relay electronic signals to the speaker in accordance with the received instructions to generate an audio signal.

16. The kit of claim 15 wherein the push button is a minimum of 2 inches (51 mm) across and the force to push the button is no greater than 3.5 pounds (15.5 N).

17. The kit of claim 15 wherein the speaker is an exciter speaker that vibrates sound throughout the metal housing.

18. The kit of claim 15 wherein the wireless network includes a server, the server containing and transmitting at least one of the datatypes for a preamble of, a stop ID, a stop name, a route number or identifier, a route title, a route description, a date of update, an alert.

19. The kit of claim 15 wherein the mounting mechanism further comprises, a metal mounting plate with at least two circular holes and at least one ellipse, two breakaway nuts, two lock washers, and two bolts, and at least three tabs to attach to the back of a waterproof metal housing.

20. The kit of claim 15 wherein the solar panel is a flexible conforming solar panel affixed to and conforming to at least a portion of the body of the waterproof metal housing.

* * * * *